US011189757B2

(12) United States Patent
Bohmer et al.

(10) Patent No.: US 11,189,757 B2
(45) Date of Patent: Nov. 30, 2021

(54) LIGHT EMITTING DIODES WITH REFLECTIVE SIDEWALLS COMPRISING POROUS PARTICLES

(71) Applicant: Lumileds LLC, San Jose, CA (US)

(72) Inventors: Marcel Rene Bohmer, Eindhoven (NL); Kentaro Shimizu, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 48 days.

(21) Appl. No.: 16/712,607

(22) Filed: Dec. 12, 2019

(65) Prior Publication Data

US 2021/0184083 A1 Jun. 17, 2021

(51) Int. Cl.
*H01L 33/50* (2010.01)
*H01L 33/56* (2010.01)
*H01L 33/60* (2010.01)

(52) U.S. Cl.
CPC ............ *H01L 33/502* (2013.01); *H01L 33/56* (2013.01); *H01L 33/60* (2013.01)

(58) Field of Classification Search
CPC ........ H01L 33/502; H01L 33/60; H01L 33/56
See application file for complete search history.

(56) References Cited

U.S. PATENT DOCUMENTS

2011/0175117 A1* 7/2011 Jagt ......................... H01L 33/44 257/88
2012/0001204 A1* 1/2012 Jagt ....................... H01L 33/504 257/88
2013/0049573 A1* 2/2013 Chien ....................... B32B 3/02 313/503
2016/0109099 A1 4/2016 Okuno
2018/0331261 A1* 11/2018 Basin .................... H01L 33/505
2019/0196069 A1 6/2019 Bohmer et al.

FOREIGN PATENT DOCUMENTS

DE 102018106695 A1 9/2019
EP 2216834 A1 8/2010
EP 3249712 A1 11/2017

OTHER PUBLICATIONS

The extended European Search Report corresponding to EP 20159572.5, dated Jul. 23, 2020, 11 pages.
EP 2409340 A0, corresponding to International application published under WO 2010/106478.
European Search Report, EP Application No. 20159572, dated Jul. 15, 2020, 4 pages.
EP2409340A1, corresponding to International application published under WO 2010/106478.
From the EPO as the ISA, Notification of Transmittal of the International Search Report and the Written Opinion of the International Searching Authority, or the Declaration, PCT/US2020/064318, dated Mar. 26, 2021, 13 pages.

* cited by examiner

*Primary Examiner* — Jay C Chang
*Assistant Examiner* — Mikka Liu

(57) ABSTRACT

Sidewall reflectors disposed on the sidewalls of an LED or pcLED comprise porous (for example, hollow) high refractive index light scattering particles dispersed in a transparent binder. The porous particles exhibit a high refractive index contrast and corresponding strong scattering at the interfaces between the porous particle material and one or more air-filled voids in each particle. These sidewall reflectors can provide light confinement with thin reflector structures, allowing close spacing between LEDs and pcLEDs, and may be advantageously employed in microLED arrays.

20 Claims, 5 Drawing Sheets

506 512 512 502 504

LIGHT EMITTING DIODES WITH REFLECTIVE SIDEWALLS COMPRISING POROUS PARTICLES

FIELD OF THE INVENTION

The invention relates generally to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

This specification discloses LEDs and pcLEDs having sidewall reflectors comprising porous (for example, hollow) high refractive index light scattering particles dispersed in a transparent binder. The porous particles exhibit a high refractive index contrast and corresponding strong scattering at the interfaces between the porous particle material and one or more air-filled voids in each particle. These sidewall reflectors can provide light confinement with thin reflector structures, allowing close spacing between LEDs and pcLEDs, Such sidewall reflectors may be advantageously employed in microLED arrays, for example, including for camera flash, display, and automotive illumination (e.g., headlights) applications.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
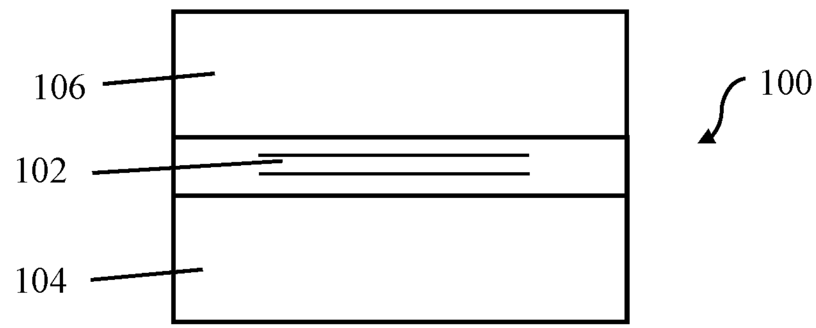
FIG. 1 shows a schematic cross-sectional view of an example pcLED.

FIG. 1 shows an example of an individual pcLED 100 comprising a light emitting semiconductor diode structure 102 disposed on a substrate 104, together considered herein an "LED", and a phosphor layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
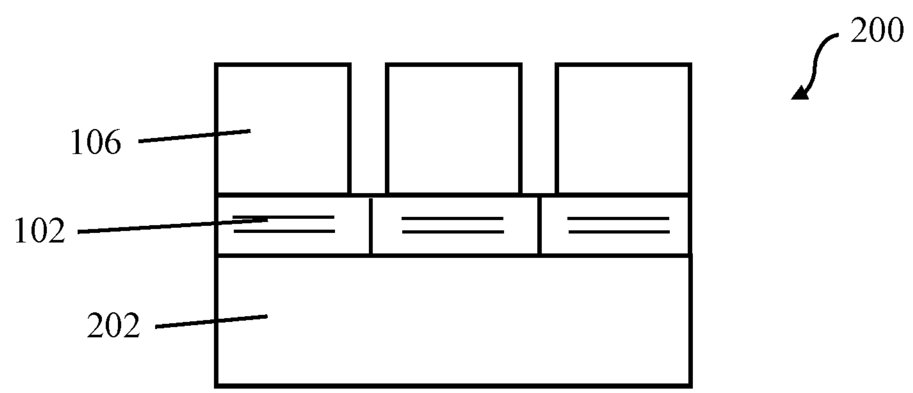
FIGS. 2A and 2B show, respectively, cross-sectional and top schematic views of an array of pcLEDs.
Figure 2B:
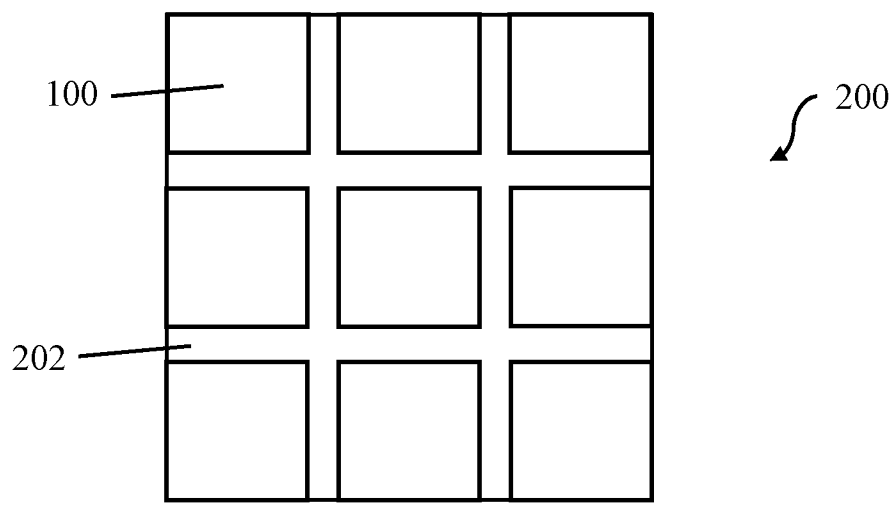

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
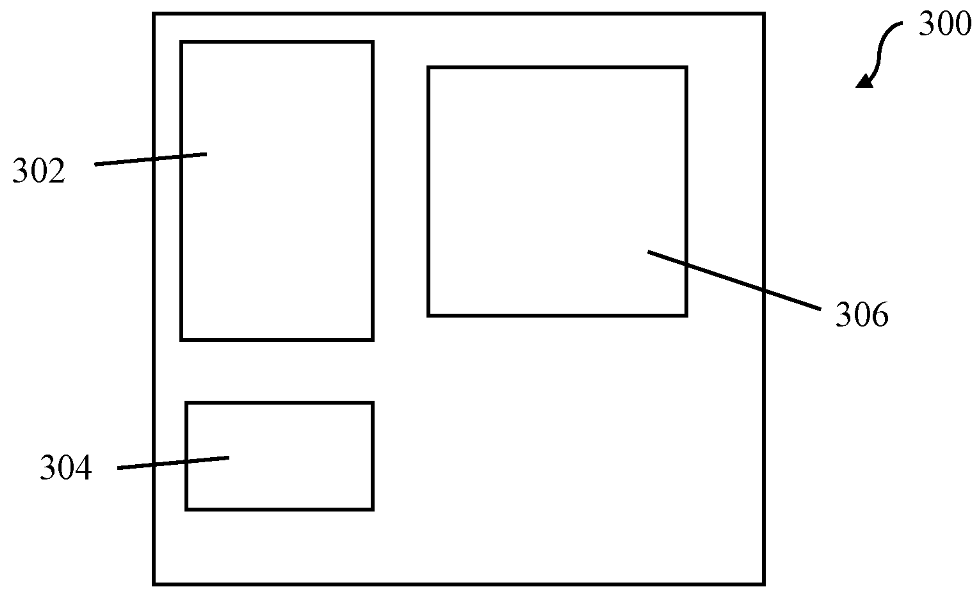
FIG. 3A shows a schematic top view of an electronics board on which an array of pcLEDs may be mounted, and FIG. 3B similarly shows an array of pcLEDs mounted on the electronic board of FIG. 3A.
Figure 3B:
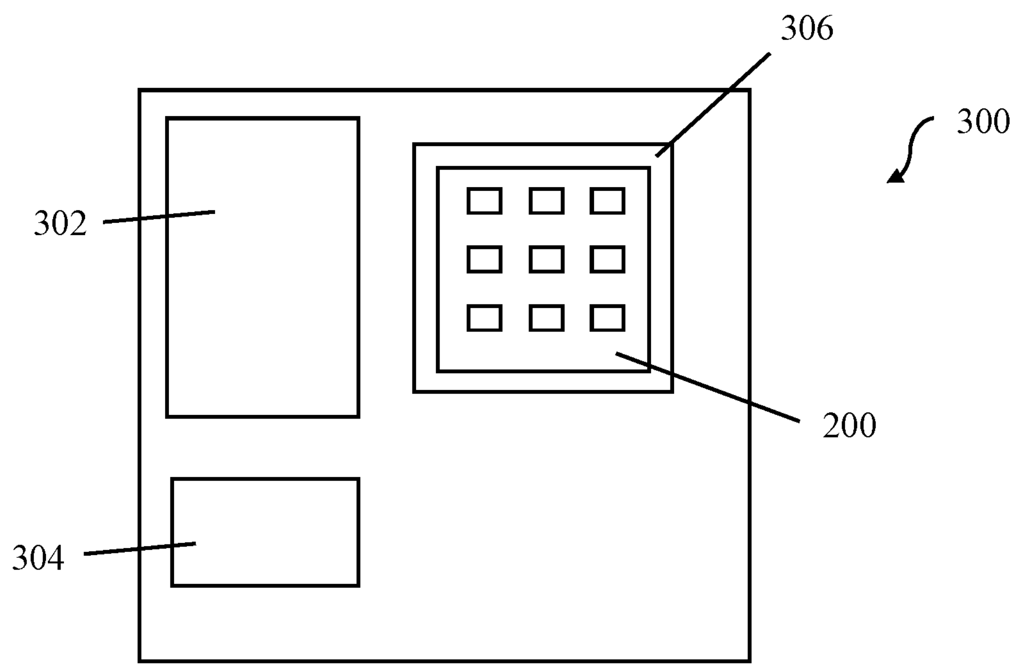

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
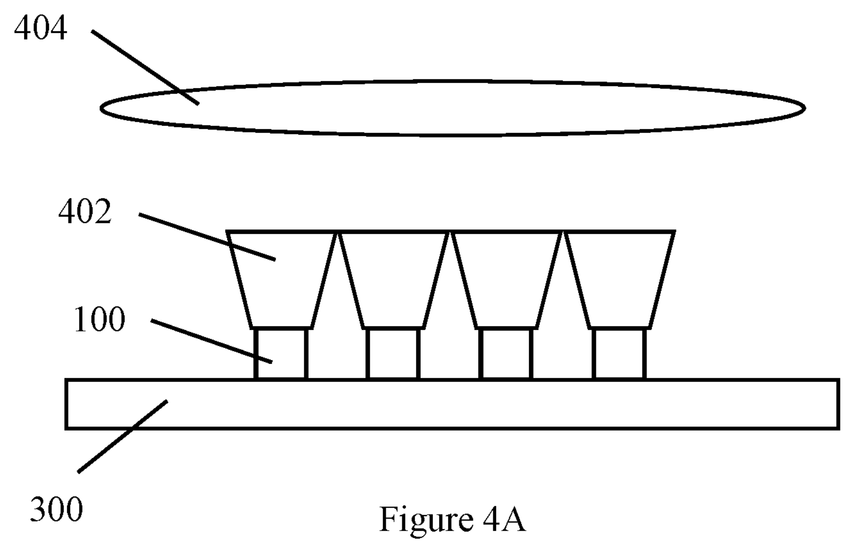
FIG. 4A shows a schematic cross sectional view of an array of pcLEDs arranged with respect to waveguides and a projection lens.
Figure 4B:
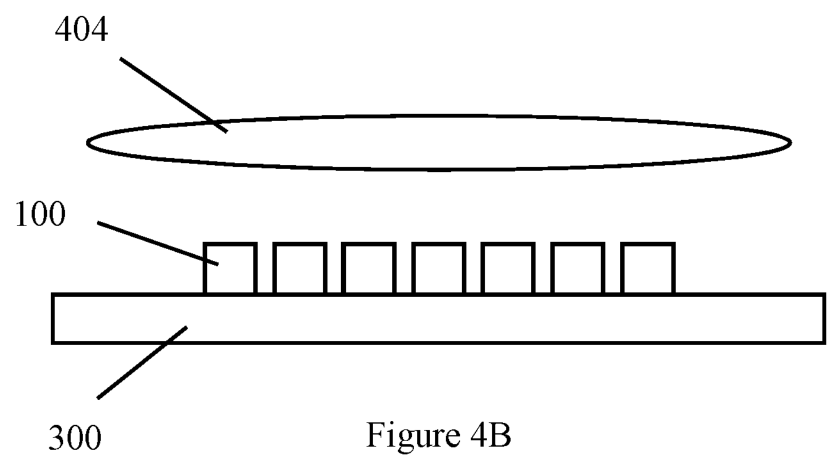
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

For many uses of pcLED arrays, it is desirable to compartmentalize the light emitted from the individual pcLEDs in the array. That is, it is advantageous to be able to operate an individual pcLED pixel in the array as a light source while adjacent pcLED pixels in the array remain dark. This allows for better control of displays or of illumination.

It is also advantageous in many applications to place the pcLEDs in an array close together. For example, a preferred configuration in microLEDs is to have minimal spacing between the individual LEDs. Also, closely spacing the pcLEDs in an array used as a camera flash light source or in an automobile headlight may simplify the requirements on any secondary optics and improve the illumination provided by the array.

However, if pcLEDs in an array are placed close together, optical cross talk between adjacent pcLED pixels may occur. That is, light emitted by a pcLED may scatter into or otherwise couple into an adjacent pcLED and appear to originate from that other pcLED, preventing the desired compartmentalization of light.

Conventionally, reflective sidewalls between adjacent pcLED pixels are used to reduce cross-talk. In one conventional approach, the reflective sidewalls are formed from high refractive index light scattering particles dispersed in a lower refractive index binder material. Light scattering arising from the high index contrast at the particle/binder interfaces optically isolates adjacent pixels from each other. Such conventional volume scattering approaches typically require a reflector sidewall thickness of greater than or equal to about 50 microns, for example, to provide sufficient optical isolation of adjacent pixels. The light scattering can be increased if the binder is replaced by air. However, the mechanically stability of such a system is poor and it is prone to contamination.

In another conventional approach, reflective sidewalls are formed from specularly reflective metal layers or specularly reflective stacks of dielectric layers (e.g., distributed Bragg reflectors.

In some applications, it is desirable to space pcLED pixels with a separation of less than or equal to 50 microns, less than or equal to 20 microns, less than or equal to 10 microns, or less than or equal to 4 microns. In such applications, conventional volume scattering reflective structures as described above are thicker than desirable. Further, in such applications it is difficult to form specularly reflective sidewalls due to the high aspect ratios of the channels (gaps) between adjacent pixels.

As summarized above in the "summary" section, this specification discloses LEDs and pcLEDs having reflective sidewalls comprising porous (for example, hollow) high refractive index light scattering particles dispersed in a transparent binder material. The pores are filled with air or another gas, or are evacuated. Typically, the refractive index of the light scattering particle material is greater than or equal to about 2.0, or greater than or equal to about 2.5, the refractive index of the binder material is greater than or equal to about 1.4, and the refractive index of the (e.g., air-filled) pore is about 1. Light scattering in these sidewall reflectors arises mostly at the high refractive index contrast interfaces between the porous particle material and one or more voids in each particle, more than at the interface between the particle and the binder material. Because the refractive index of the pores is low (about 1) compared to 1.4 or more for the binder, more light scattering can be achieved with the same particle materials (in porous form) in the same binder. Alternatively, a porous particle material with a lower refractive index may be used to achieve the same amount of scattering as with conventional non-porous particle materials. Reflective sidewalls comprising such porous light scattering particles can provide desirable light confinement with thin reflector structures having, for example, a thickness of less than or equal to about 25 microns, less than or equal to about 15 microns, less than or equal to about 10 microns, or less than or equal to about 4 microns.

The porous light scattering particles may be, for example, porous Titanium Oxide ($TiO_2$) particles or porous Zirconium Oxide ($ZrO_2$) particles, but other materials may be used if suitable. The particles may have diameters (or longest dimensions) of, for example, about 0.3 microns to about 10 microns. The pores (voids) in the particles may have diameters (or longest dimensions) of, for example, about 100 nanometers to about 500 nanometers, about 100 nanometers to about 250 nanometers, about 200 nanometers to about 250 nanometers, or about 300 nanometers. Pores having a diameter of about 200 nanometers to about 250 nanometers may provide maximum scattering. In some variations, porous light scattering particles have a diameter of about 300 nanometers and each include a single closed pore having a diameter of about 200 nanometers.

The size distribution of the light scattering particles may, for example, be bimodal with a first peak at a large diameter and a second peak at a diameter of at most $\frac{1}{4}^{th}$ the diameter of the first peak. This can be advantageous, with particles at the smaller of the two diameters fitting into gaps between particles of the larger of the two diameters.

Hollow particles, for instance hollow $TiO_2$ particles, have been used to enhance the light harvesting in photovoltaic applications (Koh et al., advanced materials 2008; Yu, J. power sources 2011; Sasanpour, J. Opt. 2011). Most experiments and theoretical studies have concentrated on particles having a single pore, but for use in sidewall reflectors as described herein it may be advantageous to form larger particles with a plurality of pores, as long as the particle size is significantly smaller than the spacing between pcLEDs. Apart from spherical particles, cylindrical hollow particles can be used to enhance the scattering effect (Sasanpour et al.).

The porous particles may include open pores, closed pores, or both open and closed pores. Open pores have a connection to the outer surface of the particle, and thus for example to the binder.

Porous particles comprising open pores may be coated with a hydrophobic material that prevents binder material from flowing into and filling or partially filling the open pores during the deposition and curing processes by which the sidewall reflectors are formed. The hydrophobic coating may coat internal surfaces defining the open pores, for example. Porous particles not comprising open pores may also be coated with a hydrophobic material to reduce sensitivity to moisture. Suitable hydrophobic materials may include, for example, silanes having hydrophobic (e.g., organic) side groups such as, for example, alkoxy-alkylsilanes, chloro-alkylsilanes, hexamethyldisilazane, and fluorinated silanes.

The transparent binder material may be for example a silicone or a sol-gel glass material.

An example process flow for making a pcLED array employing such sidewall reflectors is described next with respect to FIGS. 5A-5C. Any other suitable process may be used instead. Details of the example sidewall reflectors are described with respect to FIGS. 6A-6C.

Figure 5A:
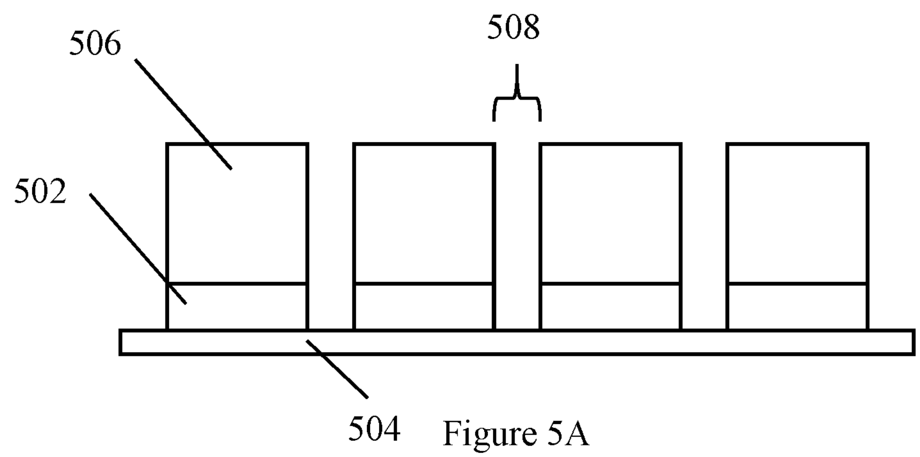
FIGS. 5A, 5B, and 5C schematically illustrate an example process flow for forming a pcLED array comprising sidewall reflectors as described herein.

FIG. 5A schematically illustrates in a cross-sectional view a portion of an example pcLED array. In the array, semiconductor light emitting diodes 502 are mounted on a substrate 504. A wavelength converting structure 506 is located on an upper surface of each light emitting diode 502, opposite from substrate 504, to form a pcLED. The wavelength converting structures 506 may be ceramic phosphor structures, phosphor particles dispersed in a binder, or any other suitable wavelength converting structure. Adjacent pcLED pixels are separated from each other by a street (gap) having a width 508. Width 508 may be, for example, less than or equal to 50 microns, less than or equal to 20 microns, or less than or equal to 10 microns, but any suitable spacing may be used.

Figure 5B:
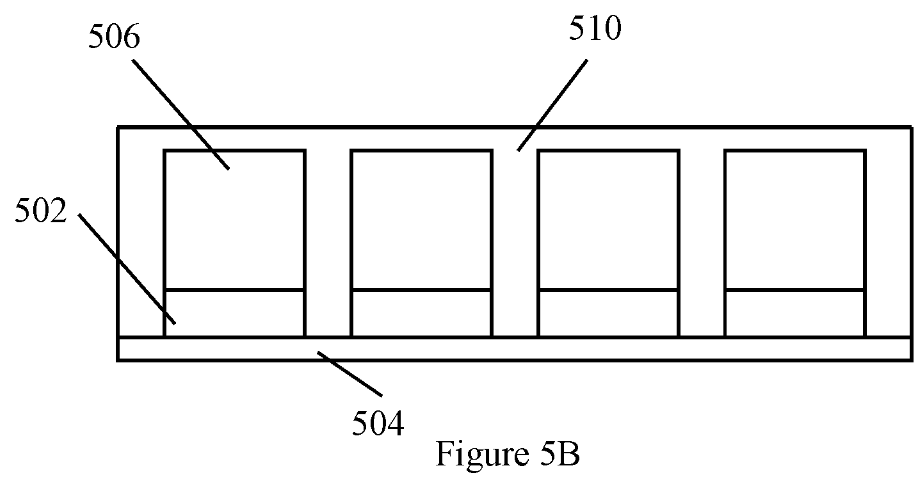

As shown in FIG. 5B a layer 510 of a light scattering composition comprising porous light scattering particles dispersed in a binder, as described above, is disposed in the streets between the pcLEDs in contact with sidewalls of the pcLEDs, and optionally over top surfaces of the pcLEDs. Layer 510 may be deposited by, for example, spin coating, spray coating, over-molding, printing, or any other suitable deposition method.

Figure 5C:
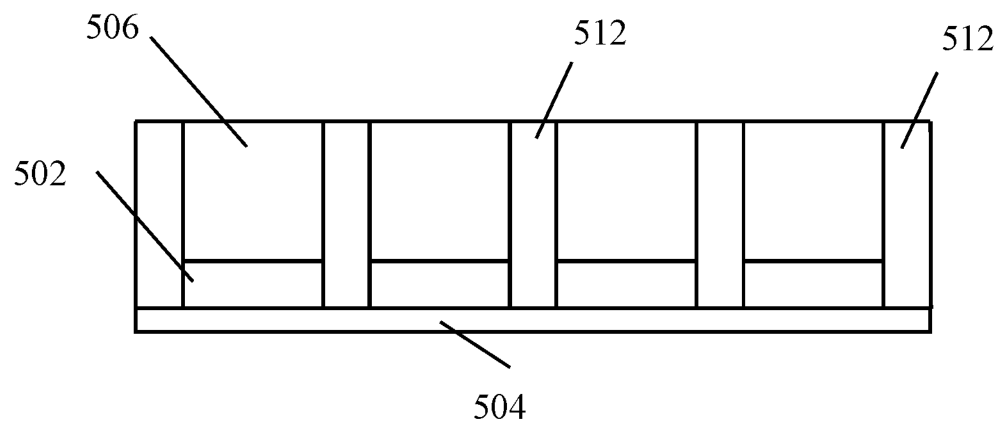

As shown in FIG. 5C, any light scattering composition present on top surfaces of the pcLEDs is removed and the remaining light scattering composition is cured to form reflective sidewalls 512 extending from substrate 504 to top light emitting surfaces of the wavelength converting structures 506.

Figure 6A:
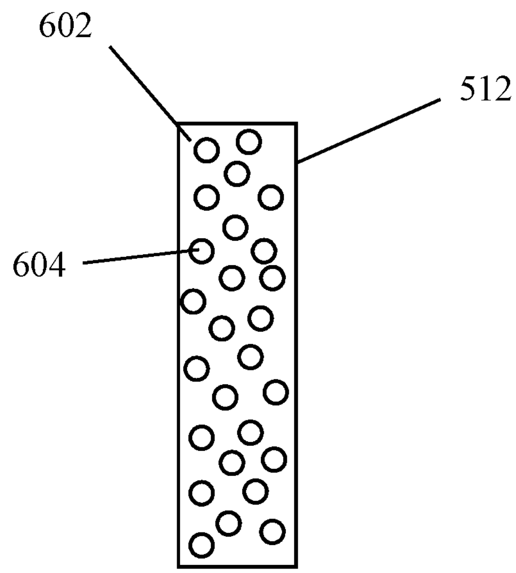
FIG. 6A schematically illustrates an example sidewall reflector comprising porous light scattering particles dispersed in a binder.
Figure 6B:
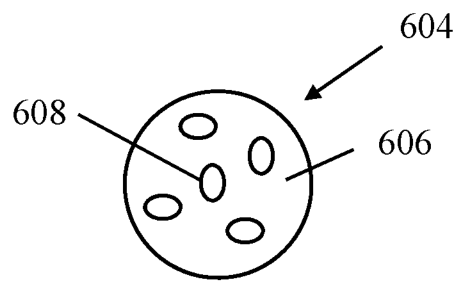
FIG. 6B schematically illustrates an example porous light scattering particle as may be employed in the sidewall reflector of FIG. 6A.
Figure 6C:
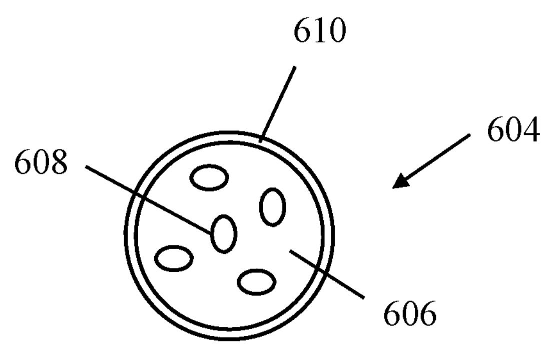
FIG. 6C schematically illustrates an example coated porous light scattering particle as may be employed in the sidewall reflector of FIG. 6B

FIG. 6A schematically shows detail of an example reflective sidewall reflector 512 comprising porous light scattering particles 604 dispersed in a binder 602. FIG. 6B schematically shows details of an example porous light scattering particle 604, comprising one or more voids 608 in particle material 606. FIG. 6C schematically shows the porous light scattering particle of FIG. 6B coated with a hydrophobic coating 610 preventing binder material 602 from entering pores 608 during deposition and curing of the light scattering composition. Hydrophobic coating 610 may, for example, penetrate or partially penetrate voids 608 that open to a surface of particle 604. Coating 610 need not form a continuous physical barrier layer as schematically shown in FIG. 6C.

This disclosure is illustrative and not limiting. Further modifications will be apparent to one skilled in the art in light of this disclosure and are intended to fall within the scope of the appended claims.

The invention claimed is:

1. A light emitting device comprising:

a substrate;

a semiconductor light emitting diode disposed on the substrate, the semiconductor diode comprising a top surface, an oppositely positioned bottom surface adjacent the substrate, and sidewalls connecting the top and bottom surfaces of the semiconductor diode;

a wavelength converting structure comprising a top light output surface, an oppositely positioned bottom surface adjacent the top surface of the semiconductor light emitting diode, and side walls connecting the top and bottom surfaces of the wavelength converting structure; and reflectors disposed on only the sidewalls of the wavelength converting structure and the semiconductor light emitting diode, the reflectors comprising porous light scattering particles dispersed in a transparent binder, the porous light scattering particles each comprising one or more gas-filled voids defined by inner surfaces of the porous light scattering particles, the reflectors substantially preventing transmission of light exiting the light emitting device through the side walls of the semiconductor diode or through the side walls of the wavelength converting structure.

2. The light emitting device of claim 1, the porous light scattering particles having a refractive index of greater than or equal to 2.0 and pores with a refractive index of 1.

3. The light emitting device of claim 1, the porous light scattering particles having diameters of 0.3 microns to 10 microns.

4. The light emitting device of claim 1, the porous light scattering particles having a bimodal size distribution with a first peak at a first diameter and a second peak at one fourth or less of the first diameter.

5. The light emitting device of claim 1, the porous light scattering particles having pores with diameters of 100 nanometers to 500 nanometers.

6. The light emitting device of claim 1, at least some of the porous light scattering particles comprising a hydrophobic coating.

7. The light emitting device of claim 6, the porous light scattering particles having pores, with internal surfaces of at least some of the pores being coated by the hydrophobic coating.

8. The light emitting device of claim 1:

the porous light scattering particles having a refractive index of greater than or equal to 2.0;

the porous light scattering particles having pores with a refractive index of 1; and the porous light scattering particles each comprising a hydrophobic coating.

9. The light emitting device of claim 8, the porous light scattering particles having diameters of 0.3 microns to 10 microns.

10. The light emitting device of claim 9, the pores having diameters of 200 nanometers to 250 nanometers.

11. A light emitting device comprising:

a plurality of phosphor converted light emitting diodes disposed on a shared substrate with adjacent pairs of the phosphor converted light emitting diodes separated by corresponding gaps; and a light scattering composition filling only the gaps to form corresponding sidewall reflectors shared by corresponding adjacent pairs of the phosphor converted light emitting diodes, the light scattering composition comprising porous light scattering particles dispersed in a transparent binder, the porous light scattering particles each comprising one or more gas-filled voids defined by inner surfaces of the porous light scattering particles, the sidewall reflectors substantially preventing transmission of light across the gaps between the corresponding adjacent pairs of the phosphor converted light emitting diodes.

12. The light emitting device of claim 11, each gap having a corresponding width between a corresponding adjacent pair of the phosphor converted light emitting diodes of less than or equal to 50 microns.

13. The light emitting device of claim 12, each gap having a corresponding width between a corresponding adjacent pair of the phosphor converted light emitting diodes of less than or equal to 15 microns.

14. The light emitting device of claim 11, the porous light scattering particles having a refractive index of greater than or equal to 2.0 and pores with a refractive index of 1.

15. The light emitting device of claim 11, the porous light scattering particles having diameters of 0.3 microns to 10 microns.

16. The light emitting device of claim 11, the porous light scattering particles having pores with diameters of 100 nanometers to 500 nanometers.

17. The light emitting device of claim 11, the porous light scattering particles each comprising a hydrophobic coating.

18. The light emitting device of claim 17, the porous light scattering particles having pores, with internal surfaces of at least some of the pores in the porous light scattering particles being coated by the hydrophobic coating.

19. The light emitting device of claim 11:

each gap having a corresponding width between a corresponding adjacent pair of the phosphor converted light emitting diodes of less than or equal to 50 microns;

the porous light scattering particles having a refractive index of greater than or equal to 2.0 and diameters of 0.3 microns to 10 microns;

the porous light scattering particles having pores with diameters of 100 nanometers to 500 nanometers and a refractive index of 1; and the porous light scattering particles each comprising a hydrophobic coating.

20. The light emitting device of claim 19, each gap having a corresponding width between a corresponding adjacent pair of the phosphor converted light emitting diodes of less than or equal to 15 microns.

* * * * *